US010866469B2

(12) United States Patent
Guan et al.

(10) Patent No.: US 10,866,469 B2
(45) Date of Patent: Dec. 15, 2020

(54) DISPLAY MODULE AND DISPLAY APPARATUS

(71) Applicant: XIAMEN TIANMA MICRO-ELECTRONICS CO., LTD., Xiamen (CN)

(72) Inventors: Linyan Guan, Xiamen (CN); Kangpeng Yang, Xiamen (CN); Yumin Xu, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/283,300

(22) Filed: Feb. 22, 2019

(65) Prior Publication Data
US 2020/0166814 A1 May 28, 2020

(30) Foreign Application Priority Data
Nov. 26, 2018 (CN) .......................... 2018 1 1417423

(51) Int. Cl.
*G02F 1/1345* (2006.01)
*G02F 1/1362* (2006.01)
*H05K 1/18* (2006.01)

(52) U.S. Cl.
CPC ...... *G02F 1/13452* (2013.01); *G02F 1/13454* (2013.01); *G02F 1/136286* (2013.01); *G02F 2001/136222* (2013.01); *H05K 1/189* (2013.01); *H05K 2201/10136* (2013.01)

(58) Field of Classification Search
CPC ............ G02F 1/13452; G02F 1/13454; G02F 1/136286; G02F 2001/136222
See application file for complete search history.

(56) References Cited

U.S. PATENT DOCUMENTS

2017/0162637 A1* 6/2017 Choi ........................ G09G 3/20

FOREIGN PATENT DOCUMENTS

CN 107039493 A 8/2017
CN 107741677 A 2/2018

* cited by examiner

*Primary Examiner* — Dung T Nguyen
(74) *Attorney, Agent, or Firm* — Anova Law Group PLLC

(57) ABSTRACT

A display module and a display apparatus are provided in the present disclosure. The display module includes a display panel having a display area, a hole area, a first binding area surrounding the hole area and at least one signal line disposed in the display area. The display module further includes a first flexible circuit board bound in the first binding area and connected to the at least one signal line, a second flexible circuit board electrically connected to the first circuit board, and a first integrated circuit chip bound on the second flexible circuit board. The first integrated circuit chip transmits signals sequentially through the second flexible circuit board and the first flexible circuit board, to the at least one signal line. The present disclosure may improve a screen ratio of the display apparatus.

19 Claims, 17 Drawing Sheets

DISPLAY MODULE AND DISPLAY APPARATUS

CROSS-REFERENCE TO RELATED APPLICATIONS

This application claims the priority of Chinese Patent Application No. 201811417423.8, filed on Nov. 26, 2018, the entire contents of which are incorporated herein by reference.

FIELD OF THE DISCLOSURE

The present disclosure generally relates to the field of display technology and, more particularly, relates to a display module and a display apparatus.

BACKGROUND

A screen ratio has been used to indicate a relative ratio between a display area and an overall display surface area of a display device. The screen ratio directly affects the visual experience of a user when using the display device. To improve the visual experience, it is desired to design a boarder of the display panel as narrow as possible to increase the screen ratio.

In existing technologies, a display panel with an increased screen ratio has been designed. Specifically, a through hole is formed in the display panel to generate a hole area. Some device modules such as an earpiece and a camera are disposed within the hole area. On one hand, however, the lower border of the display panel still needs space for binding a flexible circuit board disposed with an integrated circuit chip to provide control signals to the display panel. On the other hand, the signal lines used for transmitting the control signals need space for wiring in the border area of the hole area. Therefore, display panels have encountered bottlenecks for further reducing the size of the display border and improving the screen ratio.

Therefore, there is a need to solve technical problems to provide display module and display apparatus with improved screen ratio.

BRIEF SUMMARY OF THE DISCLOSURE

One aspect of the present disclosure provides a display module. The display module includes a display panel including a display area, a hole area, a first binding area surrounding the hole area, and signal lines disposed in the display area. The display module further includes a first flexible circuit board, a second circuit board and a first integrated circuit chip. The first flexible circuit board is bound in the first binding area and electrically connected to the signal lines. The second flexible circuit board is electrically connected to the first flexible circuit board. The first integrated circuit chip is bound on the second flexible circuit board, and transmits signals to the signal lines sequentially through the second flexible circuit board and the first flexible circuit board.

Another aspect of the present disclosure provides a display apparatus, including any of the display modules as described in the present disclosure.

Other features and advantages of the present disclosure will become more apparent via a reading of detailed descriptions of non-limiting embodiments with reference to the accompanying drawings.

BRIEF DESCRIPTION OF THE DRAWINGS

The accompanying drawings, illustrating some embodiments of the present disclosures, constitute a part of the present disclosure. These accompanying drawings together with some of the embodiments will be described in the following to illustrate the technical solutions of the present disclosure.

DETAILED DESCRIPTION

Figure 1:
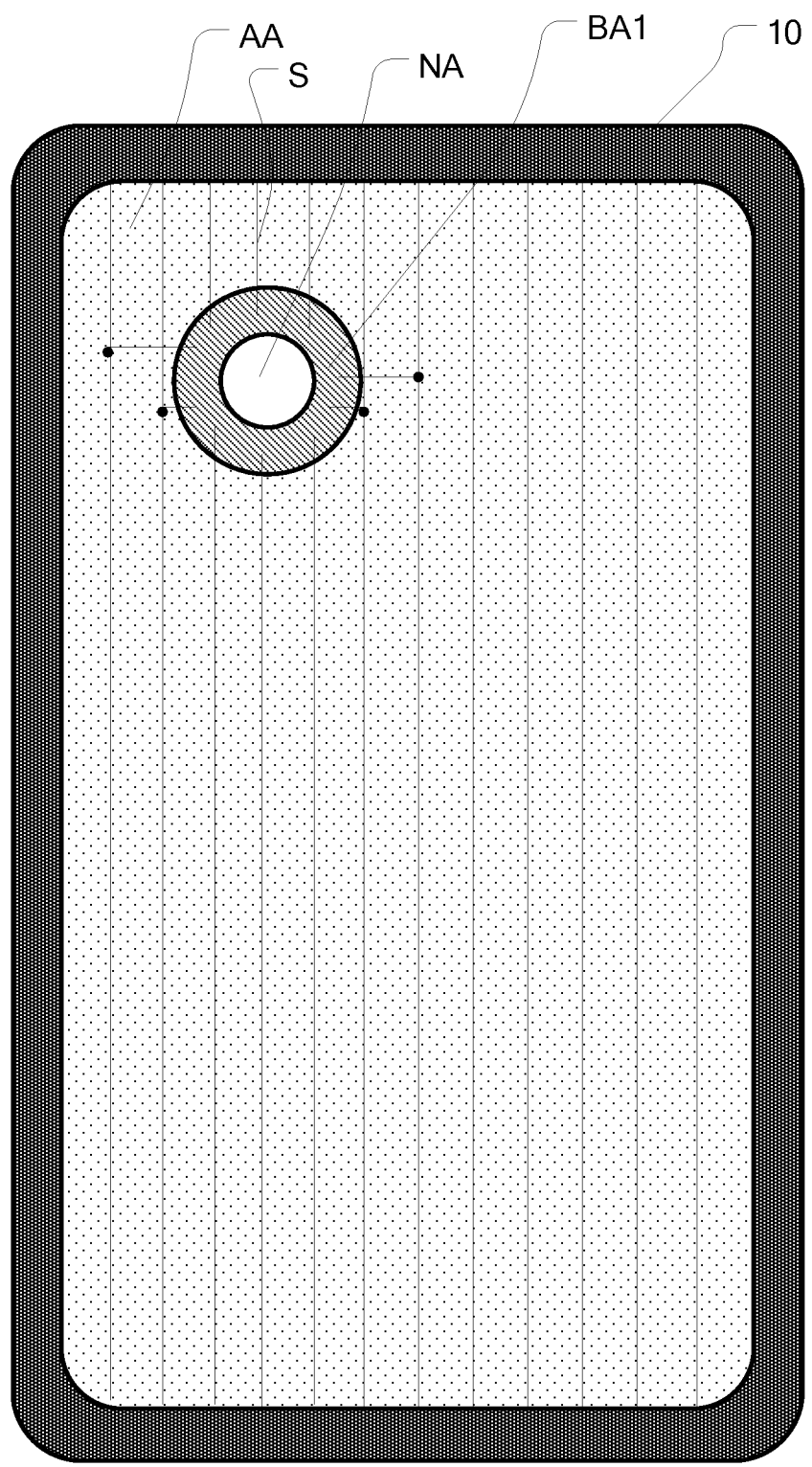
FIG. 1 illustrates a schematic diagram of a display panel in an exemplary display module according to various embodiments of the present disclosure.

Various embodiments of the present disclosure will be described in detail as follows with reference to the accompanying drawings. It should be noted that the arrangements of the elements and steps as described in these embodiments, as well as the numeric expressions and numeric values are not intended to limit the scope of the present disclosure, unless otherwise specified.

It should be understood that, the descriptions of exemplary embodiments disclosed herein are only for illustrative purpose, not intended to limit any scope of the embodiments of the present disclosure or the implementation of these embodiments.

The technologies, methods and devices that are known to one of ordinary skill in the art will not be described in detail herein, however under certain circumstances, any technology, method and device as disclosed herein should be viewed as part of the present disclosure.

Any numeric value described in exemplary embodiments of the present disclosure is only for illustrative purposes, not intended to be limiting. Accordingly, different numeric values may be applied in other exemplary embodiments of the present disclosure.

It should be noted that similar reference numerals and letters indicate similar items in the following drawings. Thus, once an item is defined in one drawing, it is unnecessary for the item to be further discussed in subsequent drawings.

Figure 2:
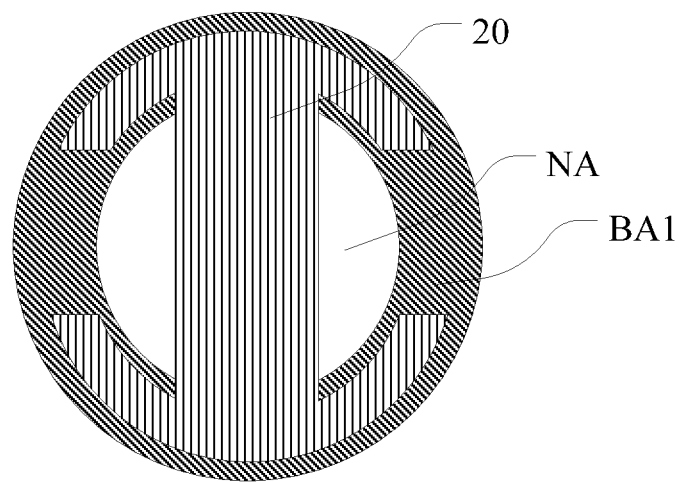
FIG. 2 illustrates a schematic diagram of a hole area in an exemplary display module according to various embodiments of the present disclosure.
Figure 3:
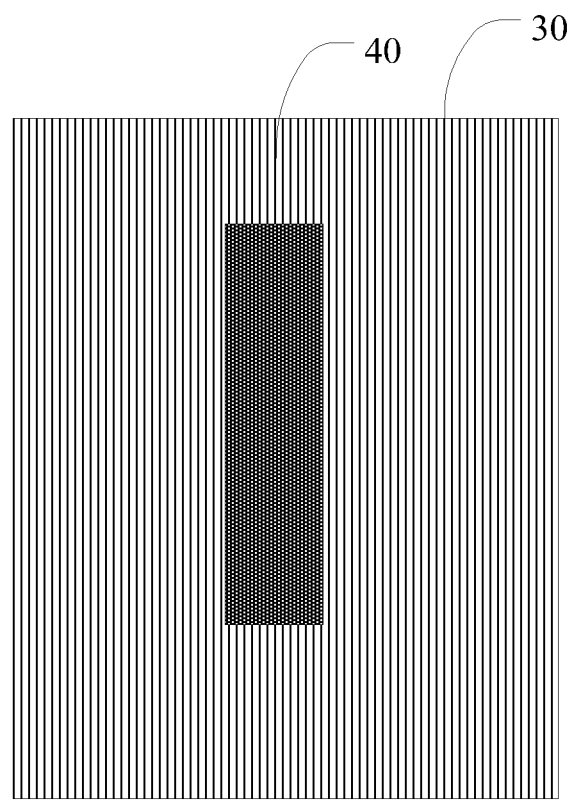
FIG. 3 illustrates a schematic diagram of a second flexible circuit board in an exemplary display module according to various embodiments of the present disclosure.

FIG. 1 illustrates a schematic diagram of a display panel in an exemplary display module according to various embodiments of the present disclosure. FIG. 2 illustrates a schematic diagram of a hole area in an exemplary display module according to various embodiments of the present disclosure. FIG. 3 illustrates a schematic diagram of a second flexible circuit board in an exemplary display module according to various embodiments of the present disclosure. In various embodiments of the present disclosure with reference to FIGS. 1-3, a display module may include a display panel 10, a first flexible circuit board 20, a second flexible circuit board 30 and a first integrated circuit chip 40.

The display panel 10 may include a display area AA, a hole area NA and a first binding area BA1 surrounding the hole area NA. Signal lines S may be arranged in the display area AA, and the signal lines S may include one or more of data signal lines, scanning signal lines and touch-control signal lines. With reference to FIG. 1, it should be noted that the wiring directions, arrangements and numbers of the signal lines S are for illustrative purposes only and not intended to limit any scope of the present disclosure.

The data signal lines may transmit data driving signals generated by the first integrated circuit chip 40 to display pixels in the display area AA. Scanning signal lines may transmit scanning driving signals generated by the first integrated circuit chip 40 to the display pixels. For example, when the display panel 10 is a liquid crystal display (LCD) panel, a display pixel may include a thin-film transistor (TFT), a common electrode and a pixel electrode. The TFT may include a gate electrode, a source electrode and a drain electrode. The drain electrode may be electrically connected to the pixel electrode, the gate electrode may be electrically connected to a scanning signal line, and the source electrode may be electrically connected to a data signal line. When the scanning signal lines supply the scanning driving signals to the gate electrode of the TFT, the source electrode and the drain electrode may be conducted to each other. The data signal lines may supply the data driving signals to the source electrode, and the data driving signals may be transmitted from the source electrode to the drain electrode, and subsequently to the pixel electrode. As such, an electric field may be formed between the pixel electrode and the common electrode. Under the electric field, liquid crystal molecules may reorient or tilt, such that the light generated by a backlight source may pass through the display pixel to realize the displaying of a corresponding gray scale by this display pixel.

Touch-control signal lines may transmit touch-control signals detected by the touch-control electrodes in the display area to the first integrated circuit chip 40. Alternatively, the touch-control signal lines may transmit the touch-control driving signals generated by the first integrated circuit chip 40 to the touch-control electrodes. For example, in an exemplary LCD display panel, the common electrode may include an array of electrode blocks arranged in a matrix, where the common electrode may be multiplexed as touch-control electrodes during a touch-control stage. That is, during a display stage, the touch-control signal lines may transmit common voltage signals to the electrode blocks, and during the touch-control stage, the touch-control signal lines may transmit touch-control signals to the electrode blocks.

It should be noted that, according to the present disclosure, the display panel 10 may be an organic light-emitting diode (OLED) display panel which is not intended to limit the scope of the present disclosure. Further, the data signal lines, scanning signal lines and touch-control signal lines in the OLED display panel may be referred to related description in existing technologies, which will not be described in detail herein.

The first flexible circuit board 20 and the second flexible circuit board 30 each may be a flexible printed circuit board made of polyimide or polyester films as base materials. The detailed wirings on the first flexible circuit board 20 and the second flexible circuit board 30 are not illustrated in the drawings. According to the embodiments of the present disclosure, the display panel may include a glass substrate and a film layer disposed on the glass substrate. A binding surface of the first binding area BA1 may be a surface of the glass substrate. The first flexible circuit board may be bound in the first binding area BA1 and electrically connected to the signal lines S. Specifically, the signals lines S may be wired within the display area AA, extending into the first binding area BA1. Alternatively, the signal lines S may connect to the connecting lines and extend into the first binding area BA1. As illustrated in FIG. 1, part of the signal lines S may extend into the first binding area BA1. Another part of the signal lines S may connect to the connecting lines, and the connecting lines may extend into the first binding area BA1. Some alternative connecting methods may be used herein, which will not be intended to be limiting. As such, a binding pad (PAD) for connecting the corresponding signal lines S may be disposed in the first binding area BA1, and a golden finger corresponding to the signal lines S may be disposed on the first flexible circuit board 20. An anisotropic conductive adhesive may be disposed between the binding PAD and the golden finger. When the first flexible circuit board 20 is aligned with the first binding area BA1, the golden finger disposed on the first flexible circuit board 20 and the binding PAD disposed in the first binding area BA1 may realize both physical connection and electrical connection between each other through the anisotropic conductive adhesive, under conditions of high temperature and high pressure. As such, the first flexible circuit board 20 may be bound in the first binding area BA1.

The first integrated circuit chip 40 may be integrated with circuits chips for the circuit units including one or more of a scan driving circuit, a data driving circuit, and a touch-control driving circuit. The first integrated circuit chip 40 may be bound on the second flexible circuit board 30, and the second flexible circuit board 30 may be electrically connected to the first flexible circuit board 20. For example, the second flexible circuit board 30 may be directly connected to the first flexible circuit board 20. Alternatively, the second flexible circuit board 30 may be connected to the first flexible circuit board 20 through other circuit structures. As such, the driving signals generated by the first integrated circuit chip 40 may be sequentially transmitted through the second flexible circuit board 30 and the first flexible circuit board 20 to the display panel. Further, the signals of signal lines or the signals applied to the signal lines S may be sequentially transmitted through the first flexible circuit board 20 and the second flexible circuit board 30 to the first integrated circuit chip 40, and then processed by the first integrated circuit chip 40.

The display module according to the exemplary embodiments of the present disclosure may include a display panel, where the display panel may further include a hole area and a binding area disposed surrounding the hole area. The integrated circuit chip may be connected to the binding area through two flexible circuit boards, thereby supplying signals to the signal lines disposed in the display panel or receiving signals from these signal lines. As such, the occupation area of the binding area BA1 located at the lower border of the display panel may be reduced or even be avoided from the lower border. Further, the wirings surrounding the hole area may be also reduced or even avoided, thereby increasing the overall screen ratio of the display apparatus and improving the display effect.

Figure 4:
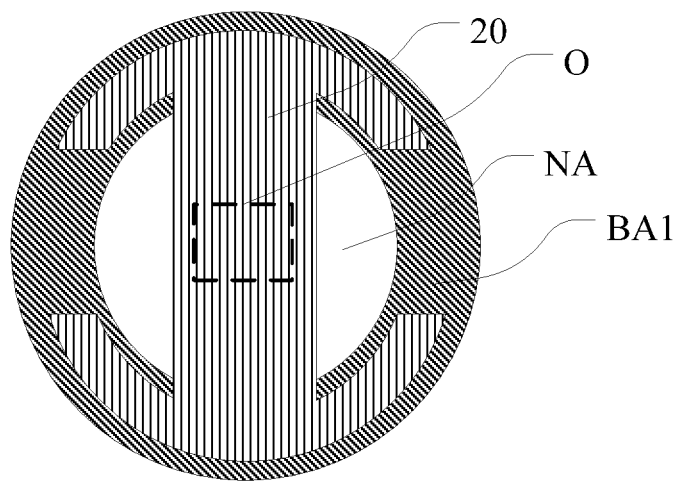
FIG. 4 illustrates a schematic diagram of a hole area in another exemplary display module according to various embodiments of the present disclosure.
Figure 5:
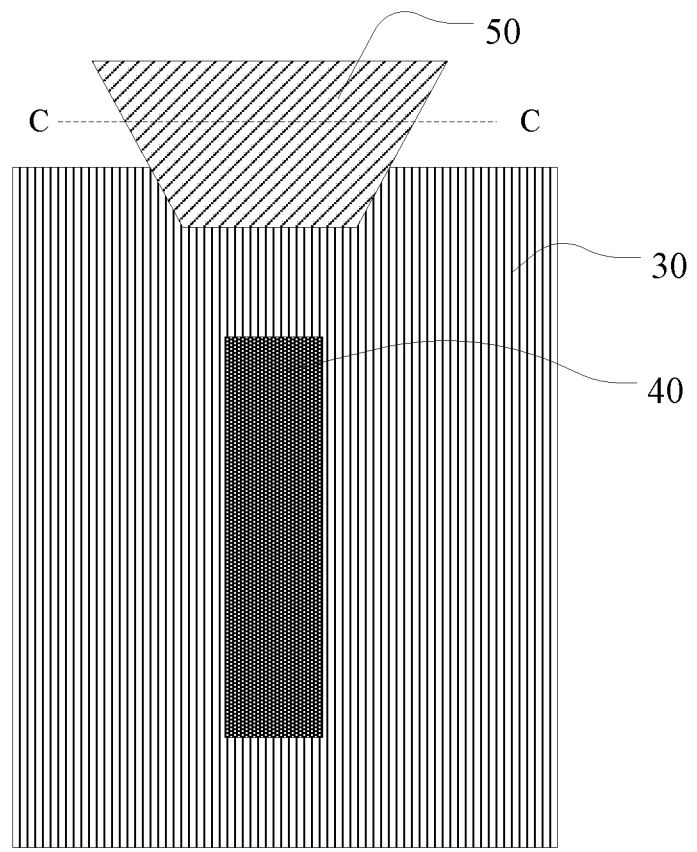
FIG. 5 illustrates a schematic diagram of a second flexible circuit board in another exemplary display module according to various embodiments of the present disclosure.

Optionally, FIG. 4 illustrates a schematic diagram of a hole area in another exemplary display module according to various embodiments of the present disclosure, and FIG. 5 illustrates a schematic diagram of the second flexible circuit board in another exemplary display module according to various embodiments of the present disclosure. In the embodiments of the present disclosure with reference to FIGS. 4 and 5, the display module may further include a demultiplexer circuit board 50. A signal input terminal of the demultiplexer circuit board 50 may be electrically connected to the first integrated circuit chip 40, and a signal output terminal of the demultiplexer circuit board 50 may be electrically connected to the first flexible circuit board 20. That is, the signals generated by the first integrated circuit chip 40 may be split through the demultiplexer circuit board 50 and then transmitted, through the first flexible circuit board 20, to the signal lines disposed in the display panel. Specifically, a dotted border area O on the first flexible circuit board 20 may be an area where the first flexible board 20 and the demultiplexer circuit board 50 are connected. Alternatively, the connection may be at other locations on the first flexible circuit board 20. The circuit architectures included in the demultiplexer circuit board 50 may be 1:2 architecture, 1:3 architecture or 1:6 architecture, or any suitable architecture without limitation. The detailed circuit structure may be correspondingly selected with respect to the requirements of the signal settings. Regardless which architecture is selected, the number of the signal output terminals of the demultiplexer circuit board 50 may be greater than the number of the signal input terminals. Accordingly, a shape of the demultiplexer circuit board 50 may be a trapezoid as illustrated in FIG. 5, for example. A short side of the trapezoid may be connected to the second flexible circuit board 30, and the signal input terminals of the demultiplexer circuit board 50 may be disposed at the short side of the trapezoid. A long side of the trapezoid may be connected to the first flexible circuit board 20 and the signal output terminals of the demultiplexer circuit board 50 may be disposed at the long side of the trapezoid. Alternatively, the demultiplexer circuit board 50 may be in any suitable shape according to various embodiments of the present disclosure.

According to the various embodiments of the present disclosure, on the one hand, the first flexible circuit board 20 may be connected to the second flexible circuit board 30 through the demultiplexer circuit board 50. On the other, the splitting effect of the demultiplexer circuit board 50 may reduce the number of pins in the first integrated circuit chip, thereby cutting the cost of manufacturing the first integrated circuit chips. In addition, the demultiplexer circuit board may be disposed outside of the display panel area, which may further improve the screen ratio of the display panel.

Figure 6:
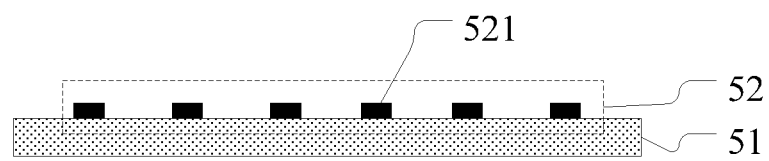
FIG. 6 illustrates a schematic diagram of a film layer of a demultiplexer circuit board in an exemplary display module according to various embodiments of the present disclosure.

Optionally, FIG. 6 illustrates a schematic diagram of film layers of the demultiplexer circuit board in an exemplary display module according to various embodiments of the present disclosure, and FIG. 6 is a sectional view of the film layers along a C-C line as illustrated in FIG. 5. In one embodiment of the present disclosure as illustrated in FIG. 6, the demultiplexer circuit board 50 may include a glass substrate 51 and demultiplexer circuits 52 disposed on the glass substrate 51. The demultiplexer circuits 52 as illustrated in FIG. 6 may further include wires 521 and other circuit components (not illustrated in FIG. 6). Detailed circuit structures of demultiplexer circuits 52 may be referred to related description in existing technologies for which will not be repeated herein.

According to the embodiments of the present disclosure, although the glass substrate on which the demultiplexer circuit board is disposed is rigid, the first flexible circuit board and the second flexible circuit board both have the flexible properties and may be bent, tilted or folded. That is, the arrangement of the demultiplexer circuit board on the glass substrate may not influence the assembly process of the display module. Further, the demultiplexer circuits being disposed on the glass substrate may easily realize the arrangements of the demultiplexer circuits in a small space.

Optionally according to the embodiment of the present disclosure with reference to FIGS. 4-6, the first flexible circuit board 20 and the second flexible circuit board 30 may be bound on the demultiplexer circuit board 50, respectively. For example, the first binding PAD connected to the signal output terminals of the demultiplexer circuit board 50 may be disposed on the glass substrate, adjacent to the signal output terminals of the demultiplexer circuit board 50. A golden finger corresponding to the first binding PAD may be disposed on the first flexible circuit board 20. An anisotropic conductive adhesive may be disposed between the first binding PAD and the golden finger corresponding to the first binding PAD. When the first flexible circuit board 20 and the demultiplexer circuit board 50 are aligned, the golden finger on the first flexible circuit board 20 and the first binding PAD may realize both physical and electrical connections between each other through the anisotropic conductive adhesive, under high temperature and high pressure. As such, the first flexible circuit board 20 may be bound with the demultiplexer circuit board 50. Further, a second binding PAD connected to the signal input terminals of the demultiplexer circuit board 50 may be disposed on the glass substrate, adjacent to the signal input terminals of the demultiplexer circuit board 50. A golden finger corresponding to the second binding PAD may be disposed on the second flexible circuit board 30. An anisotropic conductive adhesive may be disposed between the second binding PAD and the golden finger corresponding to the second binding PAD. When the second flexible circuit board 30 and the demultiplexer circuit board 50 are aligned, the golden finger on the second flexible circuit board 30 and the second binding PAD may realize both physical and electrical connections through the anisotropic conductive adhesive under high temperature and high pressure. As such, the second flexible circuit board 30 may be bound with the demultiplexer circuit board 50.

Figure 7:
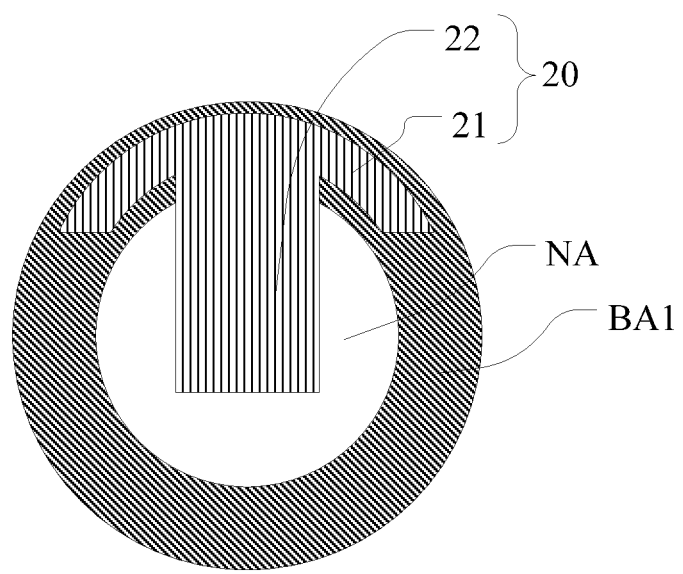
FIG. 7 illustrates a schematic diagram of a hole area in another exemplary display module according to various embodiments of the present disclosure.

Optionally, FIG. 7 illustrates a schematic diagram of a hole area in another exemplary display module according to various embodiments of the present disclosure. In FIG. 7, the first flexible circuit board 20 may include a first portion 21 and a second portion 22. The first portion 21 may be bound with the first binding area BA1 and the second portion 22 may be connected to an edge of the first portion 21 adjacent to the hole area NA.

According to the embodiments of the present disclosure, the first flexible circuit board 20 may include two portions, which are the first portion bound with the display panel and the second bound unbound with the display panel, respectively. On one side, the first flexible circuit board 20 may be bound with the display panel. On the other, during the assembly process of the display apparatus, the second portion of the first flexible circuit board may be recessed towards the back of the display panel, thereby creating some space for accommodating functional modules, e.g. cameras, within the hole area. Further, the second flexible circuit board 30 may be connected to the first flexible circuit board 20 at the second portion.

Optionally in the embodiment of the present disclosure with reference to FIG. 7, the first portion 21 may cover part of the first binding area BA1 along a circumferential direction of the hole area NA. One terminal of the second portion 22 may be connected to the first portion 21, and the other terminal may be a free terminal such that the second portion 22 may extend or bend to any position which makes the assembly of the display apparatus more flexible.

Figure 8:
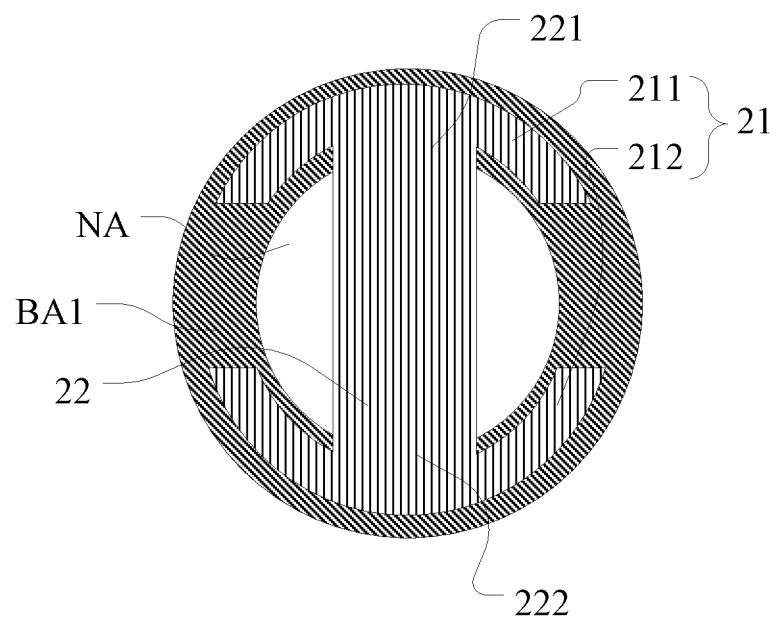
FIG. 8 illustrates a schematic diagram of a hole area in another exemplary display module according to various embodiments of the present disclosure.

Optionally, FIG. 8 illustrates a schematic diagram of a hole area in another exemplary display module according to various embodiments of the present disclosure. In the embodiment of the present disclosure, the second portion 22 may include a first terminal 221 and a second terminal 222. The first portion 21 may include a first binding part 211 connected to the first terminal 221, and a second binding part 212 connected to the second terminal 222. The first binding part 211 and the second binding part 212 may be separated from each other.

According to the embodiments of the present disclosure, the first portion 21 of the first flexible circuit board 20 may include two binding parts 211 and 212 disposed at two opposite sides of the hole area, respectively, thereby increasing the binding areas between the first flexible circuit board 20 and the display panel. As such, more or even all of the signal lines in the display panel may receive signals from the first binding area BA1, thereby reducing the occupation area of the binding area BA1 disposed at the lower border of the display panel, or even avoiding the arrangement of the binding area BA1 in the lower border. As such, the screen ratio may further be improved. The first binding part 211 and the second binding part 212 may be disposed on two terminals of the second portion 22, respectively. The signals received by the first flexible circuit 20 may be transmitted, through the wirings, to the two binding parts disposed at the top and bottom terminals of the second portion, respectively. When the binding area between the first flexible circuit board and the display panel remain the same, the wirings located at two terminals may reduce the width of the second portion as compared to the wirings only located at one terminal. As such, the second portion may occupy less part of the hole area, thereby reducing the influence on disposing the functional modules, e.g. cameras in the hole area.

Optionally in the embodiment of the present disclosure with reference to FIG. 8, the first binding part 211 and the second binding part 212 may be disposed surrounding the hole area NA, respectively. According to the embodiments of the present disclosure, such arrangements, specifically disposing the first binding part 211 and the second binding part 212 surrounding the hole area respectively, may further realize the arrangement of the binding PAD on the first flexible circuit board 20 surrounding the hole area, thereby reducing the wirings of the signal lines at the hole area.

Figure 9:
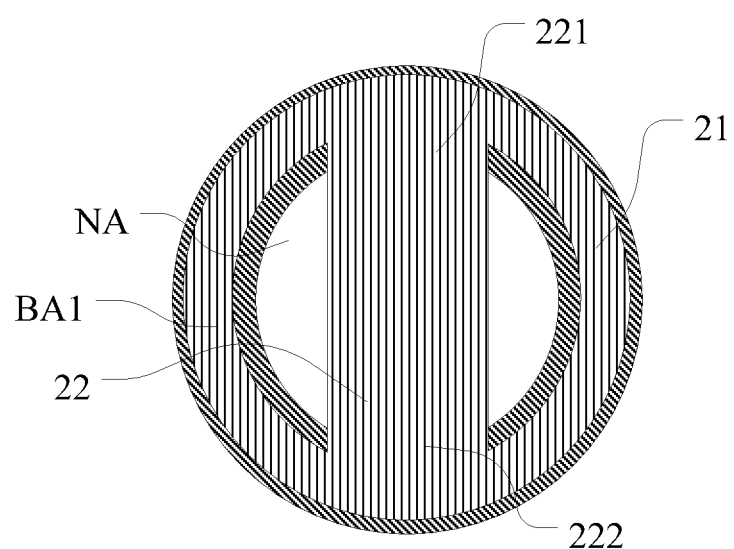
FIG. 9 illustrates a schematic diagram of a hole area in another exemplary display module according to various embodiments of the present disclosure.

Optionally, FIG. 9 illustrates a schematic diagram of a hole area in another exemplary display module according to various embodiments of the present disclosure. In the embodiment of the present disclosure with reference to FIG. 9, the first portion 21 may have a closed shape surrounding the hole area NA. Specifically, the hole area NA may be a circle area as illustrated in FIG. 9 or other shapes. Regardless which shape the hole area NA may have, nevertheless, the first portion 21 may have a closed shape surrounding the hole area NA in the embodiments of the present disclosure. According to the embodiments of the present disclosure, the first portion 21 may be surrounding the whole hole area NA, such that the binding area between the first flexible circuit board and the display panel may be maximized, and the first flexible circuit board may be connected to more signal lines.

Optionally in the embodiment of the present disclosure with reference to FIG. 9, the second portion 22 may have a first terminal 221 and a second terminal 222. The first terminal 221 and the second terminal 222 may be connected to different positions of the first portion 21. According to various embodiments of the present disclosure, the signals received by the first flexible circuit board may be transmitted, through the wires located at the two terminals of the second portion respectively, to the first portion. When the binding area between the first flexible circuit board and the display panel was maximized, the wirings located at two terminals may reduce the width of the second portion as compared to the wirings only located at one terminal. As such, the second portion may occupy less part of the hole area, thereby reducing the influence on disposing functional modules, e.g. cameras in the hole area.

Figure 10:
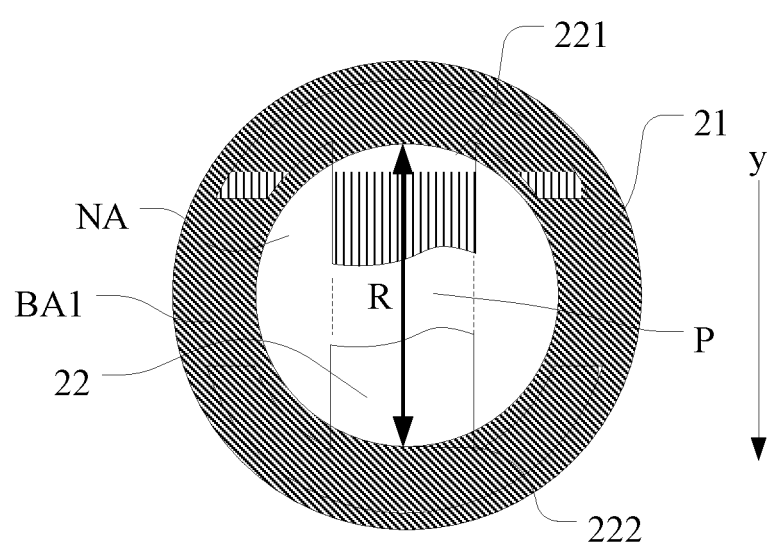
FIG. 10 illustrates a schematic diagram of a hole area in another exemplary display module according to various embodiments of the present disclosure.

Optionally, FIG. 10 illustrates a schematic diagram of a hole area in another exemplary display module according to various embodiments of the present disclosure. According to the embodiments of the present disclosure with reference to FIG. 10, along a direction y from the first terminal 221 to the second terminal 222, a length of the second portion 22 may be larger than an internal diameter R of the hole area NA. As illustrated in FIG. 10, the area with the internal diameter R may be where the second portion 22 is located. That is, along the direction y, the length of the second portion 22 may be larger than the internal diameter of the hole, and the second portion 22 may not be in a tight state. Rather, the second portion 22 may be in a flexible state, such that it may be recessed towards the hole area NA, creating some space for disposing functional modules, e.g., cameras in the hole area NA.

Figure 11:
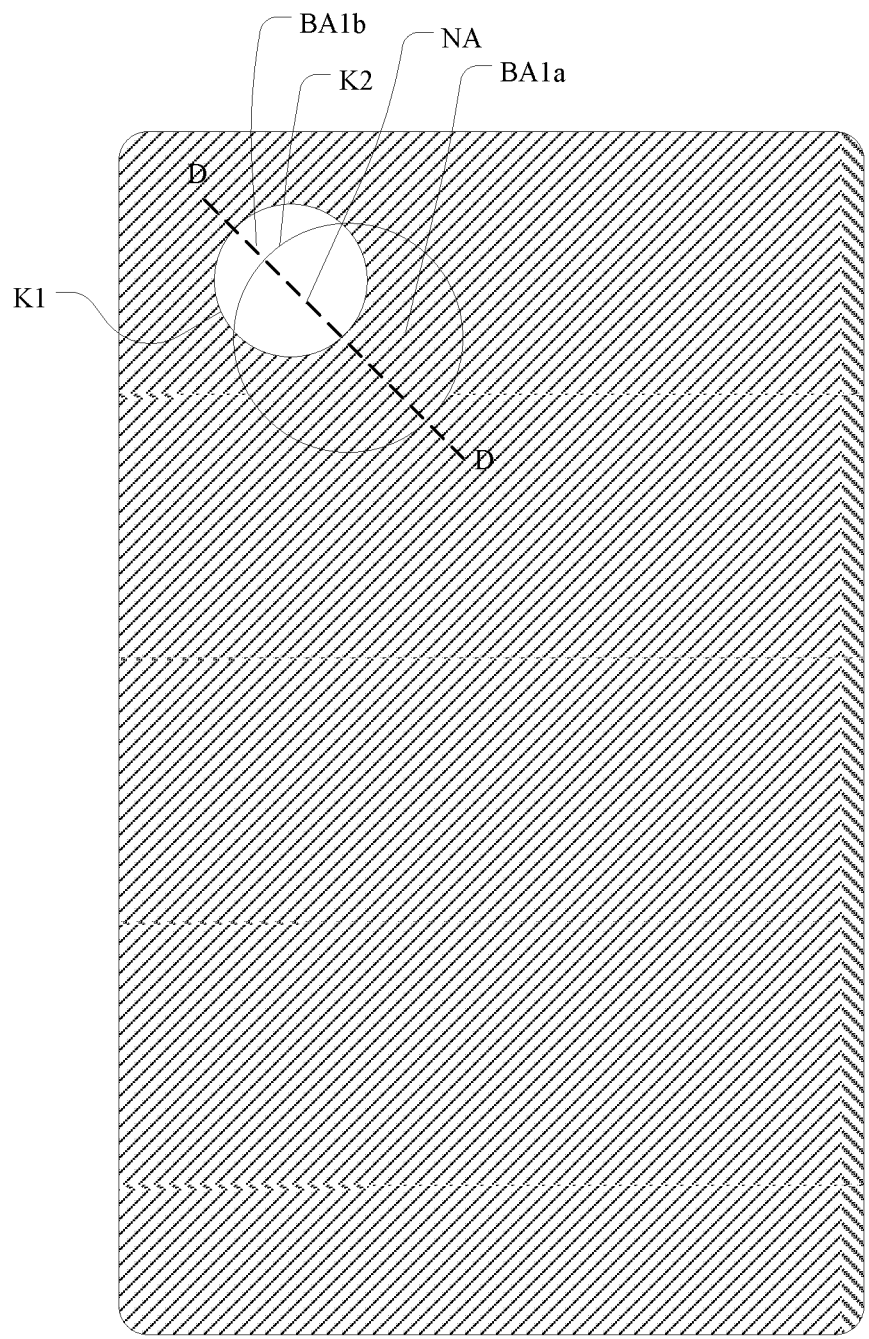
FIG. 11 illustrates a top view of a display panel in an exemplary display module according to various embodiments of the present disclosure.
Figure 12:
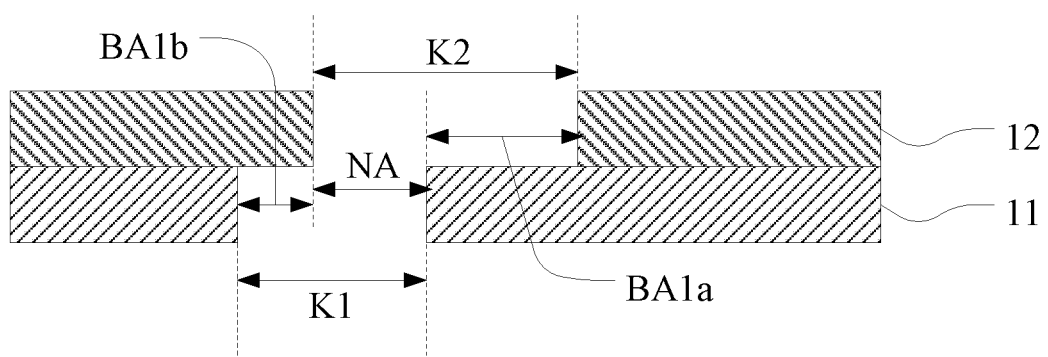
FIG. 12 illustrates a schematic diagram of a film layer of a display panel in an exemplary display module according to various embodiments of the present disclosure.

Optionally, FIG. 11 illustrates a top view of a display panel in an exemplary display module according to various embodiments of the present disclosure. FIG. 12 illustrates a schematic diagram of film layers of an exemplary display module according to various embodiments of the present disclosure, and FIG. 12 is the sectional view of the film layers along a D-D line as illustrated in FIG. 11. In the embodiments of the present disclosure as illustrated in FIGS. 11-12, the display panel 10 may include a first substrate 11, a second substrate 12 and a display material layer disposed between the first substrate 11 and the second substrate 12 (not illustrated). When the display panel is an LCD display panel, one of the first substrate 11 and the second substrate 12 may be an array substrate, and the other substrate may be a color film substrate. The display material layer disposed between the two substrates may be liquid crystal materials. When the display panel is organic light emitting display panel, one of the first substrate 11 and the second substrate 12 may be an array substrate, and the other substrate may be an encapsulating cover substrate. The display material layer disposed between the two substrates may be organic light emitting materials.

Specifically, the first substrate 11 may have a first through hole K1, and the second substrate 12 may have a second through hole K2. The first through hole K1 and the second through hole K2 may have a same size or shape, alternatively, they may have different sizes or different shapes. The first through hole K1 and the second through hole K2 may be at least partially overlapped with each other to form the hole area NA. The first binding area BA1 may include one or more of an area BA1a of the first substrate 11 exposed by the second through hole K2, and an area BA1b of the second substrate 12 exposed by the first through hole K1.

Figure 13:
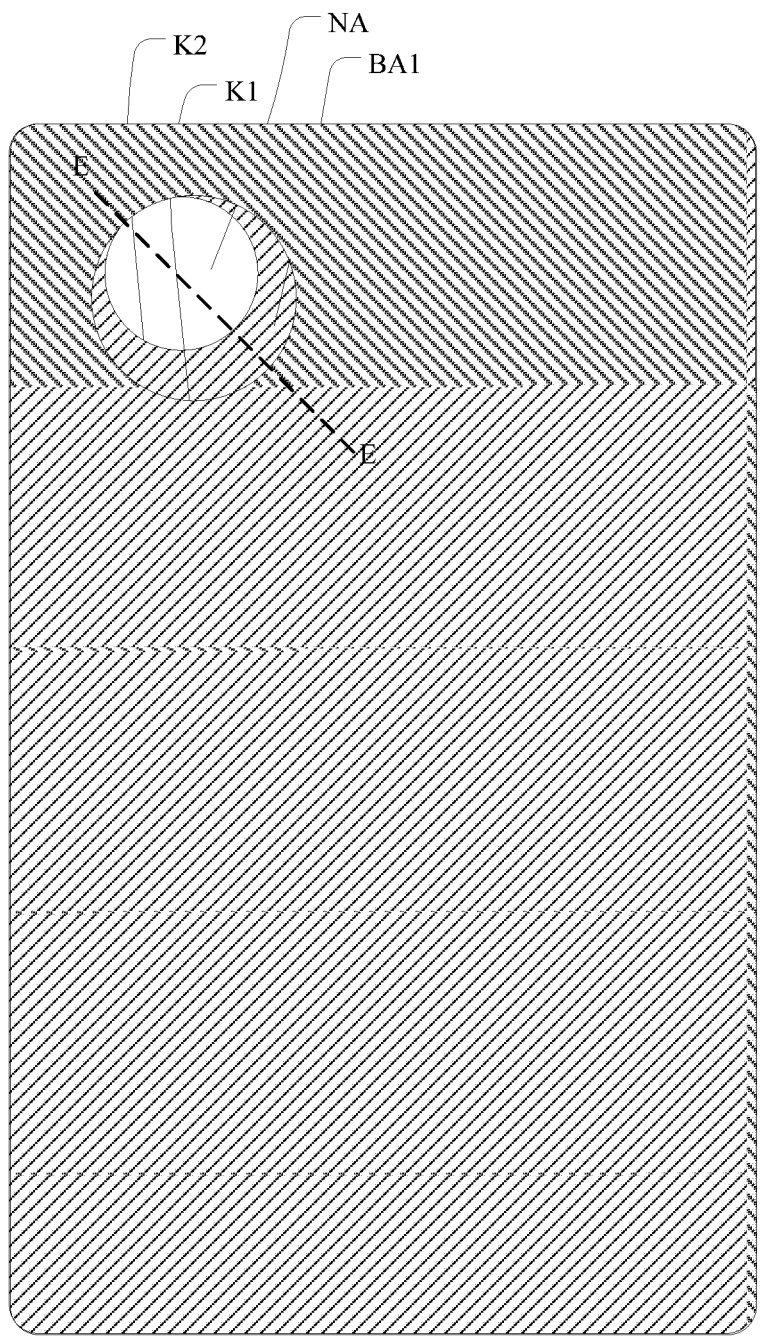
FIG. 13 illustrates a top view of a display panel in another exemplary display module according to various embodiments of the present disclosure.
Figure 14:
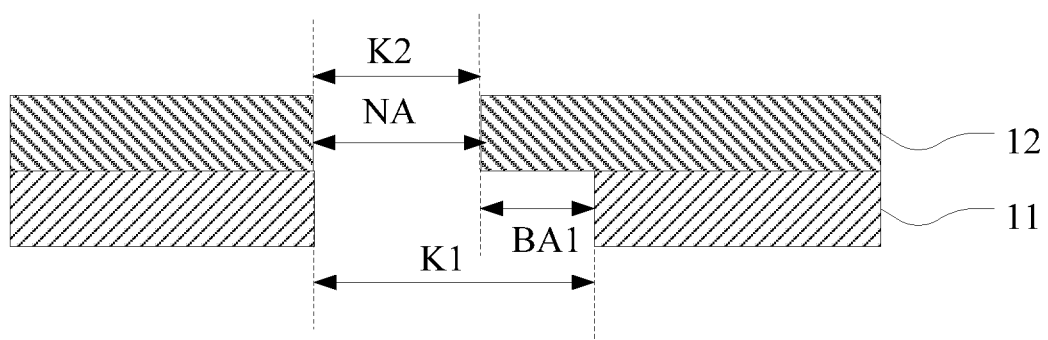
FIG. 14 illustrates a schematic diagram of a film layer of a display panel in another exemplary display module according to various embodiments of the present disclosure.

Optionally, FIG. 13 illustrates a top view of a display panel in another exemplary display module according to various embodiments of the present disclosure. FIG. 14 illustrates a schematic diagram of film layers of another exemplary display module according to various embodiments of the present disclosure, and FIG. 14 is the sectional view of the film layers along an E-E line as illustrated in FIG. 13. In the embodiments of the present disclosure as illustrated in FIGS. 13-14, a projection, e.g., an orthogonal projection, of the first through hole K1 on the second substrate 12 may cover the second through hole K2, and the area of the second substrate 12 exposed by the first through hole K1 may form the first binding area BA1. Further, the second substrate 12 may be an array substrate which may include a base substrate, a plurality of conductive layers disposed on the base substrate, and insulating layers disposed between adjacent conductive layers. The plurality of conductive layers may be formed as pixel circuits for driving display pixels and as signal lines. The first binding area BA1 may be disposed on the second substrate 12, thereby facilitating the direct connection between the binding PAD in the first binding area BA1 and the signal lines. According to the embodiments of the present disclosure, the first binding area may be disposed at one side of the base substrate of the display panel, thereby facilitating the binding between the first flexible circuit board and the first binding area, and further facilitating the connection between the binding PAD and the signal lines in the first binding area.

Optionally in the embodiment of the present disclosure with reference to FIGS. 13-14, the area of the second substrate 12 exposed by the first through hole K1 may be disposed at one side of the hole area NA.

Figure 15:
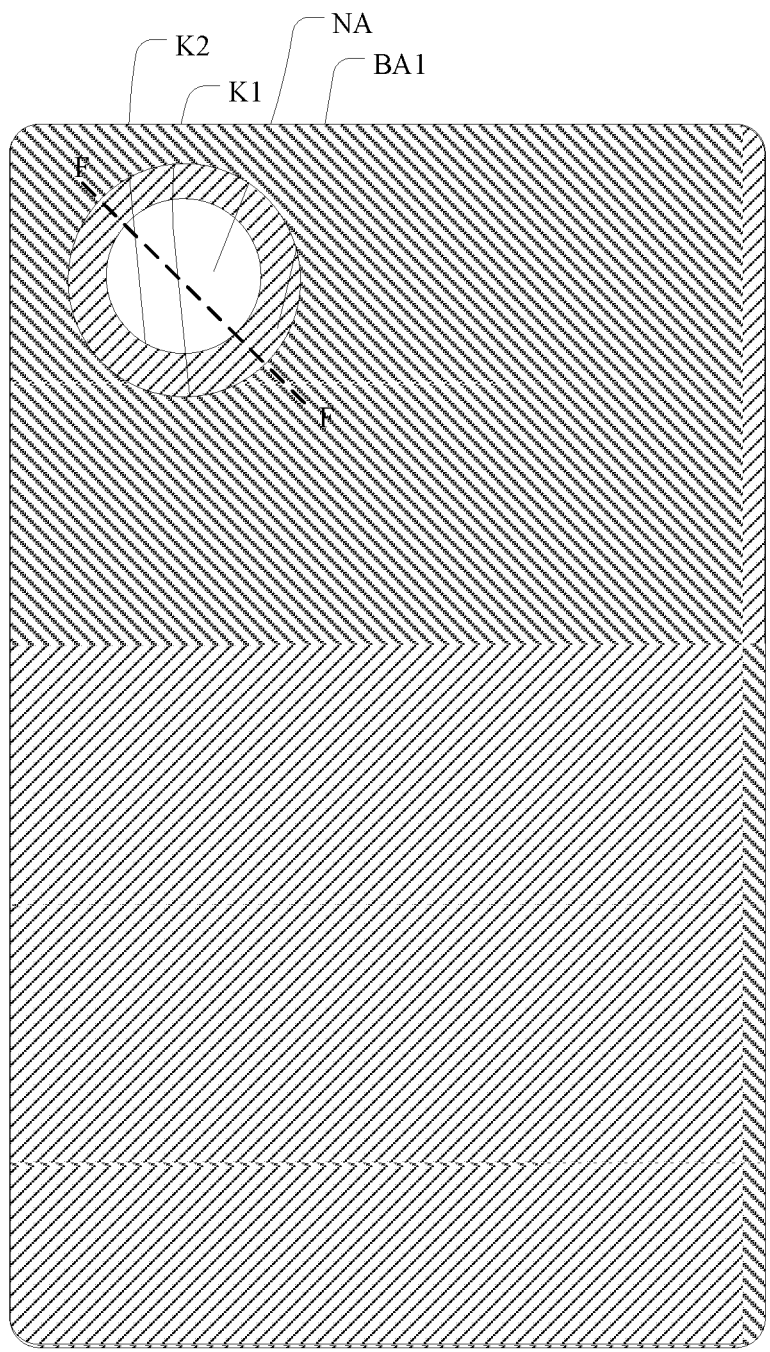
FIG. 15 illustrates a top view of a display panel in another exemplary display module according to various embodiments of the present disclosure.
Figure 16:
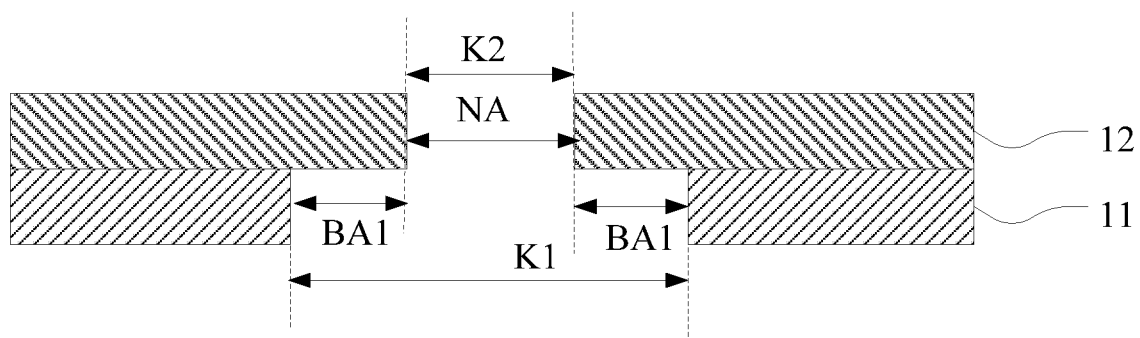
FIG. 16 illustrates a schematic diagram of a film layer of a display panel in another exemplary display module according to various embodiments of the present disclosure.

Optionally, FIG. 15 illustrates a top view of a display panel in another exemplary display module according to various embodiments of the present disclosure. FIG. 16 illustrates a schematic diagram of film layers of another exemplary display module according to various embodiments of the present disclosure, and FIG. 16 is the sectional view of the film layers along a F-F line as illustrated in FIG. 15. In the embodiments of the present disclosure, the area of the second substrate 12 exposed by the first through hole K1 may have a closed shape surrounding the hole area NA. That is, the first binding area may be disposed along a circumferential direction of the hole area NA, surrounding the edges of the hole area NA.

According to the embodiments of the present disclosure, the first binding area may be disposed along the circumferential direction of the hole area NA, surrounding the edges of the hole area NA. As such, the binding area between the first flexible circuit board and the display panel may be maximized, and the first flexible circuit board may be connected to more signal lines without complex wirings needed.

Optionally in the embodiment of the present disclosure with reference to FIGS. 15-16, the first through hole K1 may have a same shape as the second through hole K2, and a geometric center of the first through hole K1 may overlap with a geometric center of the second through hole K2. According to the embodiments of the present disclosure, the first binding area may be disposed along the circumferential direction of the hole area NA, surrounding the edges of the hole area NA. Further, the first binding area may have a uniform width along the circumferential direction of the hole area NA, such that the binding PAD connected to the first flexible circuit board may be uniformly disposed.

Figure 17:
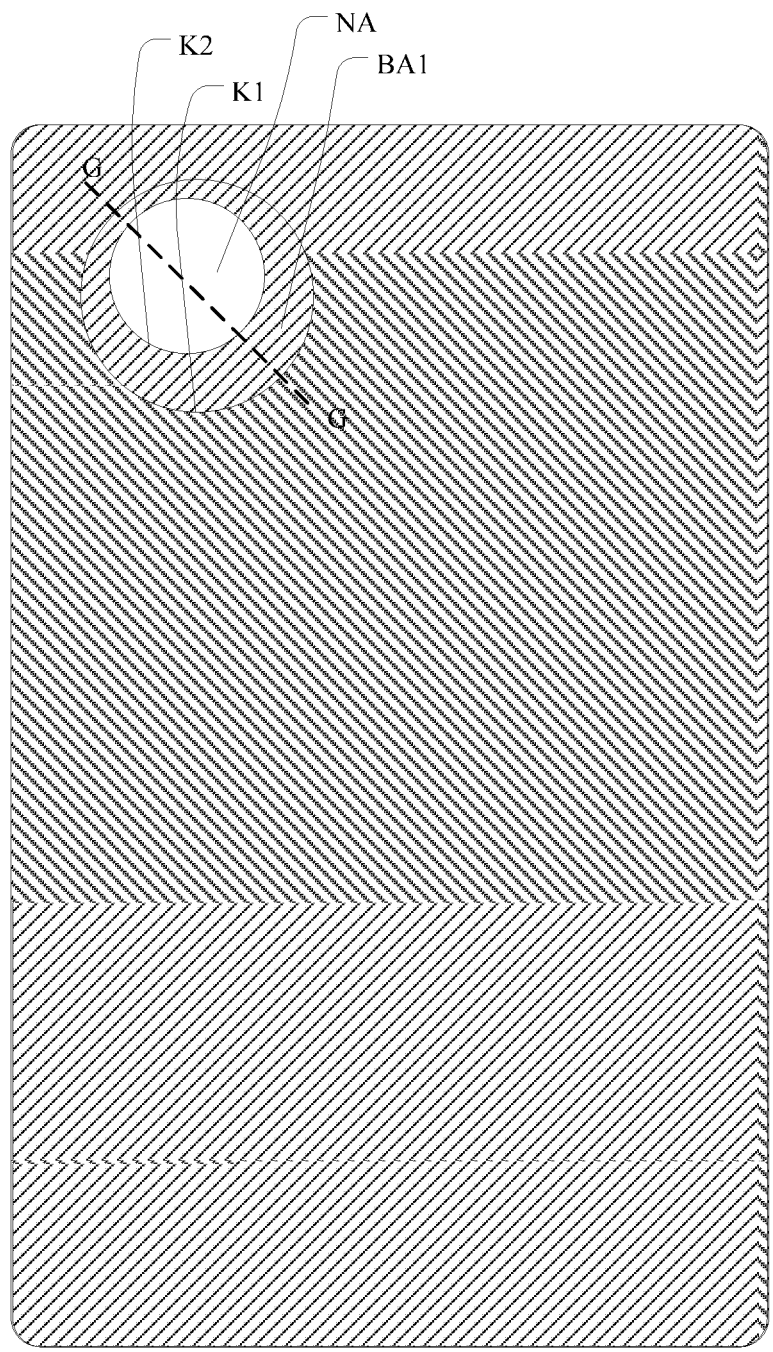
FIG. 17 illustrates a top view of a display panel in another exemplary display module according to various embodiments of the present disclosure.
Figure 18:
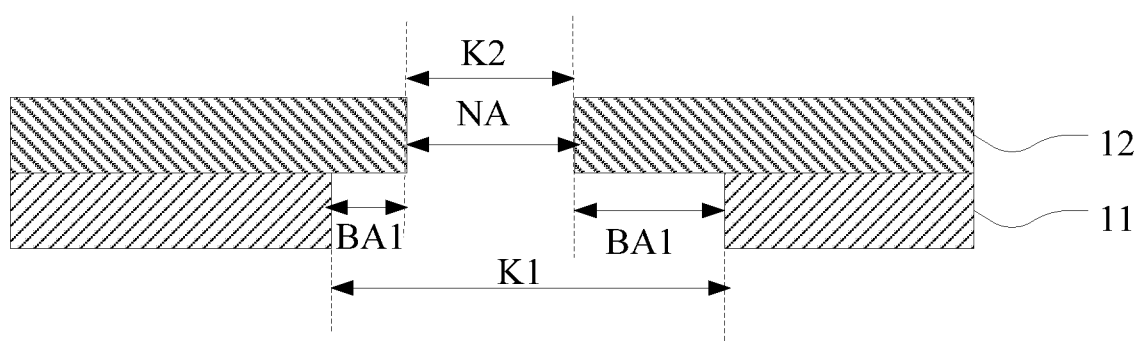
FIG. 18 illustrates a schematic diagram of a film layer of a display panel in another exemplary display module according to various embodiments of the present disclosure.

Optionally, FIG. 17 illustrates a top view of a display panel in another exemplary display module according to various embodiments of the present disclosure. FIG. 18 illustrates a schematic diagram of a film layer of another exemplary display module according to various embodiments of the present disclosure, and FIG. 18 is a the sectional view of the film layers along a G-G line as illustrated in FIG. 17. In the embodiments of the present disclosure, the first through hole K1 may have a same shape as the second through hole K2, and the geometric center of the first through hole K1 may not overlap with the geometric center of the second through hole K2.

According to the embodiments of the present disclosure, the first binding area may be disposed along the circumferential direction of the hole area NA, surrounding the edges of the hole area NA, while the width of the first binding area may not be uniform at different positions. Specifically, one side of the hole area may be away from the center of the display panel, that is, one side of the hole area may be close to the corner of the display panel. The display area may be small at the one side of the hole area. The other side of the hole area may be close to the center of the display panel, that is, the other side of the hole area may be away from the corner of the display panel. The display area may be large at the other side of the hole area. As such, the first binding area disposed at the one side of the hole area away from the center of the display panel may have a smaller width, and the signal lines may correspondingly supply signals to the smaller display area, thereby ensuring the size of the binding area without wasting any of them. Further, the first binding area disposed at the other side of the hole area close to the center of the display panel may have a larger width, and the signal lines may correspondingly supply signals to the larger display area, thereby ensuring sufficient space for disposing the binding PAD and effective utilization of the first binding area.

Optionally in the embodiments of the present disclosure, the shape of the hole area NA may be circular, elliptical, quadrangular or other irregular shapes. For example, the hole area as illustrated in FIG. 17 may have a circular shape and the hole area as illustrated in FIG. 11 may have an irregular shape.

Figure 19:
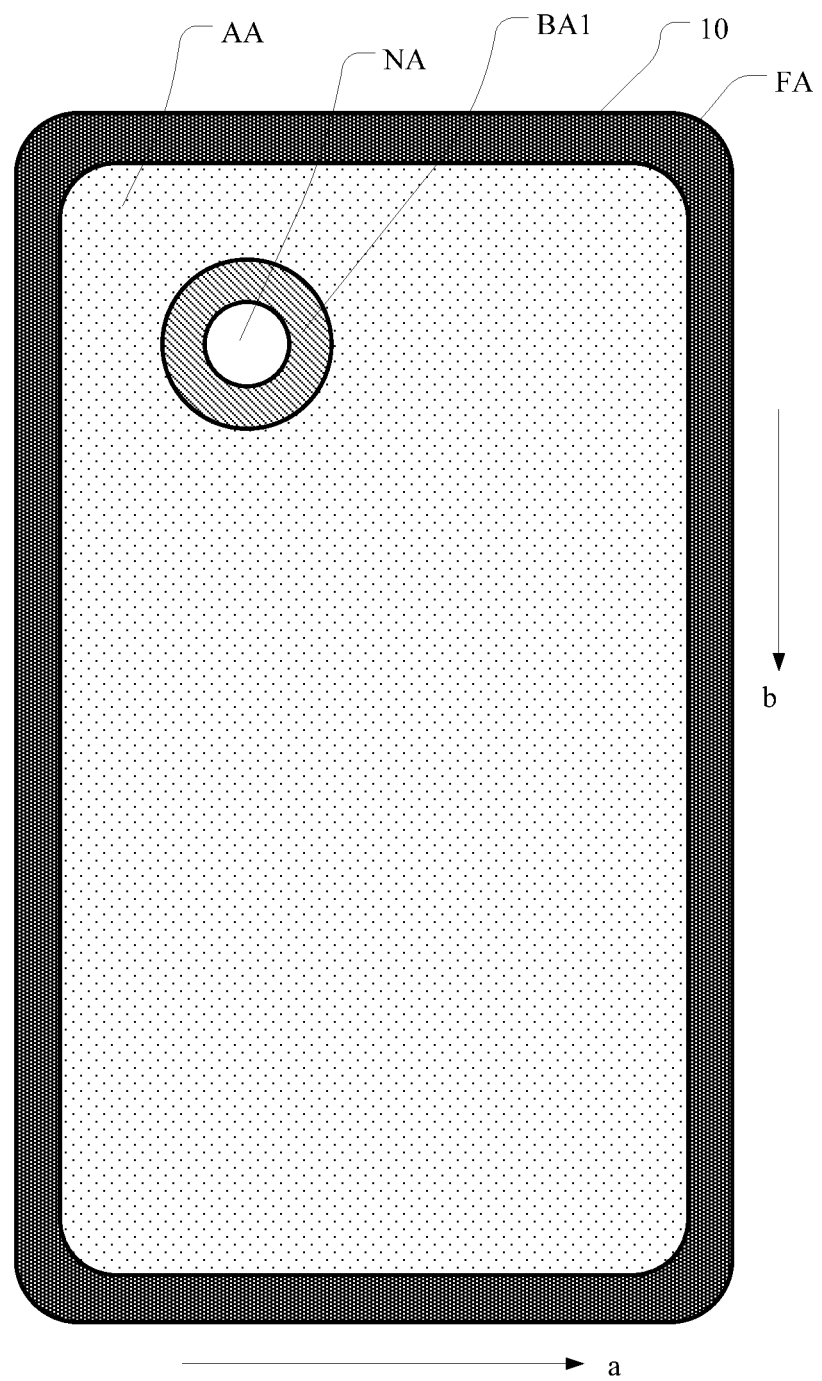
FIG. 19 illustrates a top view of a display panel in another exemplary display module according to various embodiments of the present disclosure.

Optionally, FIG. 19 illustrates a top view of a display panel in another exemplary display module according to various embodiments of the present disclosure. In the embodiment of the present disclosure with reference to FIG. 19, the display panel 10 may further include a border area FA surrounding the display area AA. The border area FA may only be used for encapsulation without any binding area being disposed. The binding area of the display panel may only include the first binding area BA1, that is, the signal lines for transmitting input and output signals of the display panel may only be disposed surrounding the edges of the hole area NA. Furthermore, the display panel may have a rectangular shape (including a rectangular shape with rounded corners), with a long side extending along the direction b and a short side extending along the direction a. The border area FA may include a first border area FA1 and a second border area FA2 extending along the direction a. The border area FA may further include a third border area FA3 and a fourth border area FA4 extending along the direction b. In existing technologies, the binding area is commonly disposed in the first border area FA1. In various embodiments of the present disclosure, the signal lines for transmitting input and output signals of the display panel may only be disposed surrounding the edges of the hole area NA, that is, only the first binding area BA1 may be disposed. As compared to existing technologies, the binding area commonly disposed in the first border area FA1 may no longer be needed, thereby further improving the screen ratio and realizing a display panel with ultra-narrow upper and lower borders.

Figure 20:
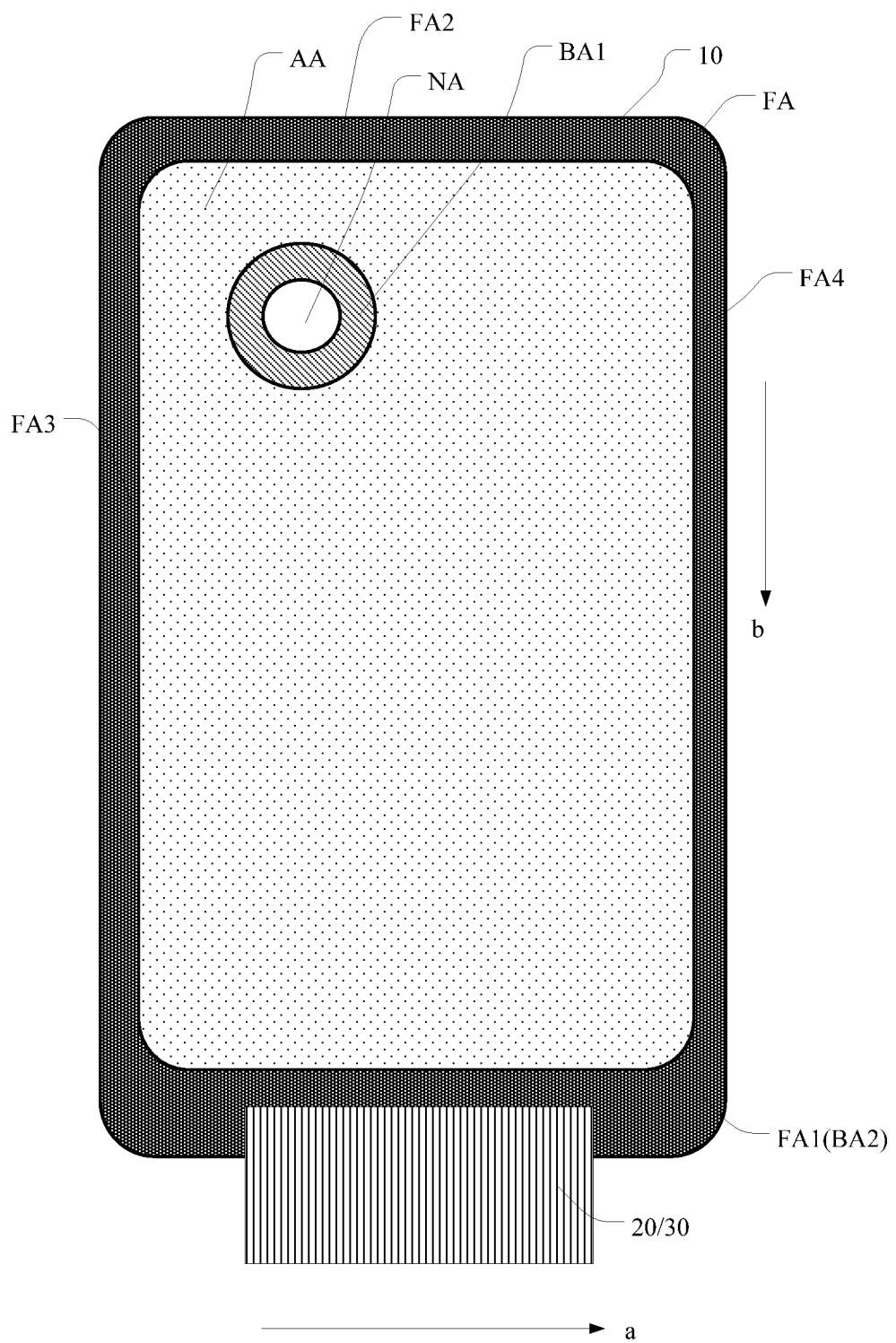
FIG. 20 illustrates a top view of a display panel in another exemplary display module according to various embodiments of the present disclosure.

Optionally, FIG. 20 illustrates a top view of a display panel in another exemplary display module according to various embodiments of the present disclosure. In the embodiment of the present disclosure with reference to FIG. 20, the display panel may further include a border area FA surrounding the display area AA. The border area FA may include a second binding area BA2, and one or more of the second flexible circuit board 30 and the first flexible circuit board 20 may be bound in the second binding area BA2. That is, the second binding area BA2 may be disposed in the border area FA. The binding area of the display panel may include the first binding area BA1 and the second binding area BA2. The wirings for transmitting input and output signals of the display panel may be disposed surrounding the edges of the hole area NA and the edges of the border area AA. Further, the display panel may have a rectangular shape (including a rectangular shape with rounded corners), with a long side extending along the direction b and a short side extending along the direction a. The border area FA may include a first border area FA1 and a second border area FA2 extending along the direction a. The border area FA may further include a third border area FA3 and a fourth border area FA4 extending along the direction b. In existing technologies, the binding area is commonly disposed in the first border area FA1. In the embodiments of the present disclosure, the first binding area BA1 and the second binding area BA2 may be disposed. Part of the signal lines for transmitting input and output signals to the display panel may be bound to the first binding area BA1, and the other part of the signal lines may be bound to the second binding area BA2. The two binding areas may be used to flexibly adjust and allocate the binding positions of the input and output signals of the display panel according to the routings and the numbers of the signal lines.

The present disclosure further provides a display apparatus, including any of the display panels as described in the present disclosure, for which the related descriptions may not be repeated herein.

Figure 21:
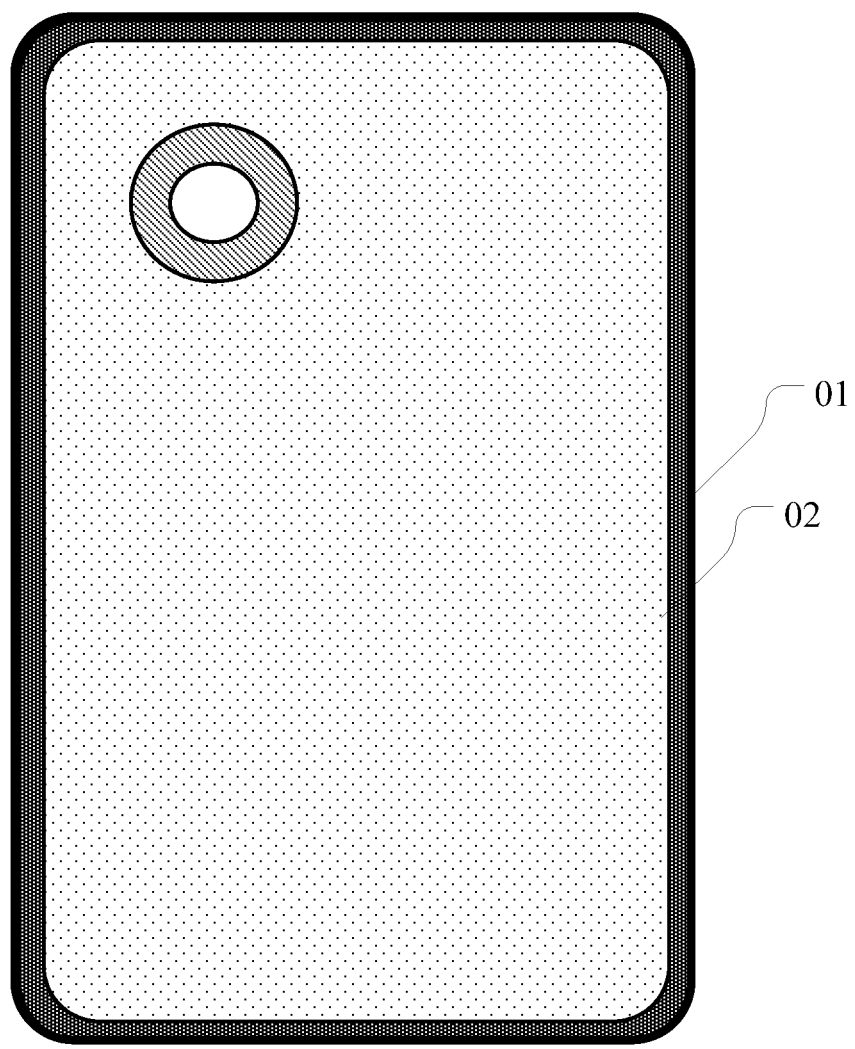
FIG. 21 illustrates a schematic diagram of an exemplary display module according to various embodiments of the present disclosure.

FIG. 21 illustrates a schematic diagram of an exemplary display apparatus according to various embodiments of the present disclosure. In the embodiments of the present disclosure with reference to FIG. 21, the display apparatus may include a housing 01 and a display module 02 located within the housing 01, where the display module may include any one of the exemplary display modules in the various embodiments as described above.

As disclosed herein, the display module and the display apparatus may have at least the following beneficial effects. In various embodiments of the present disclosure, the display panel may include a hole area and a binding area disposed surrounding the hole area. An integrated circuit chip may be connected to the binding area through two flexible circuit boards, thereby supplying signals to the signal lines of the display panel, or receiving signals from the signal lines of the display panel. As such, the occupation area of the binding area disposed at the lower border of the display panel may be reduced or the binding area may even be avoided from the lower border. Further, the wirings surrounding the hole area may be also reduced or even removed, thereby increasing the overall screen ratio of the display apparatus and improving the display effect.

Apparently, it is unnecessary for any one of the various embodiments of the present disclosure to simultaneously achieve each of the beneficial effects as disclosed above.

Although the present disclosure has been described in detail with reference to the foregoing embodiments, it is readily apparent to one ordinary skill in the art that the foregoing embodiments as described are merely for explanatory purpose, and not intended to be limiting. It is also apparent to one ordinary skill in the art that these embodiments may be modified or substituted, without departing from the scope of the various embodiments of the present disclosure. Instead, the scope of the present disclosure is defined by appended claims.

What is claimed is:

1. A display module comprising;
   a display panel, comprising:
      a display area, wherein at least one signal line is disposed in the display area,
      a hole area, and
      a first binding area surrounding the hole area;
   a first flexible circuit board, bound in the first binding area surrounding the hole area and electrically connected to the at least one signal line;
   a second flexible circuit board, electrically connected to the first flexible circuit board; and
   a first integrated circuit chip, bound on the second flexible circuit board and transmitting signals to the at least one signal line sequentially through the second flexible circuit board and the first flexible circuit board,
   wherein:
      the first flexible circuit board includes a first portion and a second portion, wherein the first portion is bound in the first binding area, and the second portion is connected to an edge of the first portion adjacent to the hole area; and
      the second portion overlaps with the hole area.

2. The display module according to claim 1, further comprising:

a demultiplexer circuit board, wherein a signal input terminal of the demultiplexer circuit board is electrically connected to the first integrated circuit chip, and a signal output terminal of the demultiplexer circuit board is electrically connected to the first flexible circuit board.

3. The display module according to claim 2, wherein:
the demultiplexer circuit board includes a glass substrate and a demultiplexer circuit disposed on the glass substrate.

4. The display module according to claim 3, wherein:
the first flexible circuit board and the second flexible circuit board are bound with the demultiplexer circuit board, respectively.

5. The display module according to claim 1, wherein:
the first portion further includes a first binding part and a second binding part separated from the first binding part,
the second portion further includes a first terminal and a second terminal,
the first binding part is connected to the first terminal, and the second binding part is connected to the second terminal.

6. The display module according to claim 5, wherein:
the first binding part and the second binding part are disposed surrounding the hole area, respectively.

7. The display module according to claim 5, wherein:
along a direction from the first terminal to the second terminal, a length of the second portion is larger than an internal diameter of the hole area.

8. The display module according to claim 1, wherein:
the first portion has a closed shape surrounding the hole area.

9. The display module according to claim 8, wherein:
the second portion includes a first terminal and a second terminal, and
the first terminal and the second terminal are connected to different positions of the first portion, respectively.

10. The display module according to claim 1, wherein:
the display panel further includes a first substrate including a first through hole and a second substrate including a second through hole,
the first through hole at least partially overlaps with the second through hole, thereby forming the hole area, and
the first binding area includes one or more of an area of the second substrate exposed by the first through hole and an area of the first substrate exposed by the second through hole.

11. The display module according to claim 10, wherein:
a projection of the first through hole on the second substrate covers the second through hole, and
the area of the second substrate exposed by the first through hole forms the first binding area.

12. The display module according to claim 11, wherein:
the area of the second substrate exposed by the first through hole has a closed shape surrounding the hole area.

13. The display module according to claim 12, wherein:
the first through hole and the second through hole have a same shape, and
a geometric center of the first through hole overlaps with a geometric center of the second through hole.

14. The display module according to claim 12, wherein:
the first through hole and the second through hole have a same shape, and
a geometric center of the first through hole does not overlap with a geometric center of the second through hole.

15. The display module according to claim 10, wherein:
the display panel includes a liquid crystal display panel,
the first substrate includes a color film substrate, and
the second substrate includes an array substrate.

16. The display module according to claim 1, wherein:
a shape of the hole area includes one of a circular shape, an elliptical shape, a quadrangular shape and an irregular shape.

17. The display module according to claim 1, wherein:
the at least one signal line includes one or more of a data signal line, a scanning signal line and a touch-control signal line.

18. The display module according to claim 1, wherein:
the display panel further includes a border area surrounding the display area, the border area including a second binding area, and
one or more of the second flexible circuit board and the first flexible circuit board are bound in the second binding area.

19. A display apparatus, comprising:
a display module, comprising:
a display panel, wherein the display panel includes:
    a display area, wherein at least one signal line is disposed in the display area,
    a hole area, and
    a first binding area surrounding the hole area;
a first flexible circuit board, bound in the first binding area surrounding the hole area and electrically connected to the at least one signal line;
a second flexible circuit board, electrically connected to the first flexible circuit board; and
a first integrated circuit chip, bound on the second flexible circuit board and transmitting signals to the at least one signal line sequentially through the second flexible circuit board and the first flexible circuit board,
wherein:
the first flexible circuit board includes a first portion and a second portion, wherein the first portion is bound in the first binding area, and the second portion is connected to an edge of the first portion adjacent to the hole area; and
the second portion overlaps with the hole area.

* * * * *